United States Patent
Liu

(10) Patent No.: US 12,057,065 B2
(45) Date of Patent: Aug. 6, 2024

(54) PIXEL DRIVING CIRCUIT, PIXEL DRIVING METHOD AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Bin Liu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/434,000

(22) PCT Filed: Jun. 30, 2021

(86) PCT No.: PCT/CN2021/103728
§ 371 (c)(1),
(2) Date: Aug. 25, 2021

(87) PCT Pub. No.: WO2022/233083
PCT Pub. Date: Nov. 10, 2022

(65) Prior Publication Data
US 2024/0021153 A1   Jan. 18, 2024

(30) Foreign Application Priority Data
May 6, 2021   (CN) .......................... 202110491871.8

(51) Int. Cl.
*G09G 3/3233* (2016.01)
*H01L 25/16* (2023.01)
*H01L 27/12* (2006.01)

(52) U.S. Cl.
CPC ......... *G09G 3/3233* (2013.01); *H01L 25/167* (2013.01); *H01L 27/1255* (2013.01);
(Continued)

(58) Field of Classification Search
CPC ......... G09G 3/3233; G09G 2300/0819; G09G 2300/0852; G09G 2310/08; H01L 25/167; H01L 27/1255
See application file for complete search history.

(56) References Cited

U.S. PATENT DOCUMENTS 7,903,057 B2 *  3/2011  Uchino ................ G09G 3/3233
                                                      345/76
8,860,637 B2 * 10/2014  Yamamoto ........... G09G 3/3233
                                                      345/80
(Continued)

FOREIGN PATENT DOCUMENTS

CN  106504701 A   3/2017
CN  107301845 A  10/2017
(Continued)

OTHER PUBLICATIONS

International Search Report in International application No. PCT/CN2021/103728, mailed on Jan. 24, 2022.
(Continued)

*Primary Examiner* — David Tung
(74) *Attorney, Agent, or Firm* — PV IP PC; Wei Te Chung; Zhigang Ma

(57) ABSTRACT

A pixel driving circuit, a pixel driving method and a display device are proposed. In a threshold detecting phase, a threshold voltage of a first TFT is detected. In a data write-in phase, data voltage is written into the first node to alleviate the coupling effect of the voltage variation of the first node on the third node such that the voltage of the third node could be stabilized. In a light emitting phase, the first
(Continued)

capacitor and the light emitting diode work together to compensate for the threshold voltage, IR drop in the signal and the unevenness of the LEDs.

1 Claim, 2 Drawing Sheets

(52) U.S. Cl.
CPC ............... *G09G 2300/0819* (2013.01); *G09G 2300/0852* (2013.01); *G09G 2310/08* (2013.01)

(56) References Cited

U.S. PATENT DOCUMENTS

| | | | |
|---|---|---|---|
| 2007/0109232 A1 | 5/2007 | Yamamoto | |
| 2011/0115764 A1 | 5/2011 | Chung | |
| 2011/0164071 A1 | 7/2011 | Chung | |
| 2011/0193850 A1* | 8/2011 | Chung | H05B 45/44 345/212 |
| 2011/0199357 A1* | 8/2011 | Chung | G09G 3/3233 345/76 |
| 2013/0249883 A1* | 9/2013 | Hwang | G09G 3/3275 345/212 |
| 2014/0139502 A1* | 5/2014 | Han | G09G 3/3233 345/212 |
| 2014/0176520 A1* | 6/2014 | Hwang | G09G 3/003 257/40 |
| 2016/0189627 A1* | 6/2016 | Park | G09G 3/3291 345/78 |
| 2016/0210906 A1 | 7/2016 | In | |
| 2018/0190197 A1* | 7/2018 | Chang | G09G 3/3233 |
| 2022/0383815 A1* | 12/2022 | Toyomura | G09G 3/3233 |

FOREIGN PATENT DOCUMENTS

| | | |
|---|---|---|
| CN | 207474026 U | 6/2018 |
| CN | 112071275 A | 12/2020 |
| JP | 2005195756 A | 7/2005 |
| WO | 2016150372 A1 | 9/2016 |

OTHER PUBLICATIONS

Written Opinion of the International Searching Authority in International application No. PCT/CN2021/103728, mailed on Jan. 24, 2022.

Chinese Office Action in corresponding Chinese Patent Application No. 202110491871.8 dated Jan. 10, 2022, pp. 1-11.

* cited by examiner

PIXEL DRIVING CIRCUIT, PIXEL DRIVING METHOD AND DISPLAY DEVICE

CROSS REFERENCE

This application is a US national phase application based upon an International Application No. PCT/CN2021/103728, filed on Jun. 30, 2021, which claims the priority of Chinese Patent Application No. 202110491871.8, entitled "PIXEL DRIVING CIRCUIT, PIXEL DRIVING METHOD AND DISPLAY DEVICE", filed on May 6, 2021, the disclosure of which is incorporated herein by reference in its entirety.

FIELD OF THE DISCLOSURE

The present disclosure relates to a display technology, and more particularly, to a pixel driving circuit, a pixel driving method and a display device.

BACKGROUND

Recently, the light emitting diode (LED) display technology becomes the research target because it has advantages including wider color gamut and higher contrast.

In the LED display technologies, the conventional passive matrix (PM) driving mechanism requires a very large instant current and thus has a high demand for the power and power consumption. On the other hand, the active matrix (AM) driving mechanism scans each row to illuminate the LEDs through thin film transistor (TFT) switches and capacitors. This could effectively avoid the above-mentioned huge instant current issue. As the progress of the AM driving mechanism, some issues have revealed. For example, the threshold voltage of the driving TFT may shift if the driving TFT works for a long period of time and this reduces the LED current. In addition, the Mura issue may occur because there may be current variations between different LEDs due to the IR-drop in the signal line in the display panel and the unevenness of the LEDs.

SUMMARY

Technical Problem

One objective of an embodiment of the present disclosure is to provide a pixel driving circuit, a pixel driving method and a display device, in order to compensate for the IR drop in the signal line and the unevenness of the LEDs. Therefore, it could avoid the Mura issue caused by current variations between different LEDs due to the IR-drop in the signal line in the display panel and the unevenness of the LEDs and raises the stability of the display device.

Technical Solution

According to an embodiment of the present disclosure, a pixel driving circuit is disclosed. The pixel driving circuit comprises: a first thin film transistor (TFT), having a gate electrically connected to a first node, a first electrode electrically connected to a second node, and a second electrode electrically connected to a third node; a first capacitor, having a first electrode plate electrically connected to the first node and a second electrode plate electrically connected to the third node; a third TFT, having a gate receiving a second scan signal, a first electrode receiving a data signal, and a second electrode; a fourth TFT, having a gate receiving a fourth scan signal, a first electrode electrically connected to the first node, and a second electrode electrically connected to the second node; a second capacitor, having a first electrode plate electrically connected to the second electrode of the third TFT and a second electrode plate electrically connected to the first node; and a light emitting diode, having an anode electrically connected to the third node and a cathode receiving a common signal.

Optionally, the pixel driving circuit further comprises:
a second TFT, having a gate receiving a first scan signal, a first electrode receiving the data signal, and a second electrode electrically connected to the third node;
a fifth TFT, having a gate receiving a first scan signal, a first electrode receiving a power signal, and a second electrode electrically connected to the second node; and
a sixth TFT, having a gate receiving a third scan signal, a first electrode receiving the power signal, and a second electrode electrically connected to the first node.

Optionally, one of the first TFT, the second TFT, the third TFT, the fourth TFT, the fifth TFT and the sixth TFT is a single-crystalline silicon TFT, a poly-silicon TFT, an amorphous TFT, an oxide TFT, a low temperature poly-silicon oxide transistor or an organic TFT.

Optionally, one of the first TFT, the second TFT, the third TFT, the fourth TFT, the fifth TFT and the sixth TFT is an N-type transistor or a P-type transistor.

Optionally, all of the first TFT, the second TFT, the third TFT, the fourth TFT, the fifth TFT and the sixth TFT are N-type transistors.

Optionally, the light emitting diode is an LED, a mini-LED, a micro-LED, or an OLED.

Optionally, the light emitting diode comprises an LED capacitor and an LED transistor.

Optionally, the LED capacitor and the LED transistor are connected in parallel.

According to an embodiment of the present disclosure, a pixel driving method adopted by the above-mentioned driving circuit to drive a pixel is disclosed. The method comprises: performing an initialization process on a voltage of the first node and a voltage of the third node in an initialization phase; turning on the fourth TFT to detect a threshold voltage of the first TFT in a threshold voltage detecting phase, wherein the fourth scan signal has an effective voltage level; turning on the third TFT to write in a data voltage into the first node in a data write-in phase, wherein the second scan signal has an effective voltage level and the first capacitor and the light emitting diode are connected in parallel; and turning on the first TFT such that a power signal is transferred through the first TFT to the light emitting diode in a light emitting phase.

According to an embodiment of the present disclosure, a display device is disclosed. The display device comprises the above-mentioned pixel driving circuit.

The present disclosure provides a pixel driving circuit, a pixel driving method and a display device. The pixel driving circuit comprises a first TFT, a third TFT, a fourth TFT, a first capacitor, a second capacitor and a light emitting diode. In the threshold detecting phase, the threshold voltage of the first TFT is detected through the fourth TFT. In the data write-in phase, the data voltage is written into the first node G through the third TFT. In addition, the first capacitor and the light emitting diode is connected in parallel to use the capacitor of the light emitting diode to alleviate the coupling effect of the voltage variation of the first node on the third node such that the voltage of the third node could be stabilized. In the light emitting phase, the first capacitor and the light emitting diode work together to compensate for the threshold voltage, IR drop in the signal and the unevenness of the LEDs. This could avoid the Mura issue caused by current variations between different LEDs due to the IR-drop in the signal line in the display panel and the unevenness of the LEDs and raises the stability of the display device.

Advantageous Effect

The present disclosure provides a pixel driving circuit, a pixel driving method and a display device. The pixel driving circuit comprises a first TFT, a third TFT, a fourth TFT, a first capacitor, a second capacitor and a light emitting diode. In the threshold detecting phase, the threshold voltage of the first TFT is detected through the fourth TFT. In the data write-in phase, the data voltage is written into the first node G through the third TFT. In addition, the first capacitor and the light emitting diode is connected in parallel to use the capacitor of the light emitting diode to alleviate the coupling effect of the voltage variation of the first node on the third node such that the voltage of the third node could be stabilized. In the light emitting phase, the first capacitor and the light emitting diode work together to compensate for the threshold voltage, IR drop in the signal and the unevenness of the LEDs. This could avoid the Mura issue caused by current variations between different LEDs due to the IR-drop in the signal line in the display panel and the unevenness of the LEDs and raises the stability of the display device.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DETAILED DESCRIPTION

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

One objective of an embodiment of the present disclosure is to provide a pixel driving circuit, a pixel driving method and a display device, in order to compensate for the IR drop in the signal line and the unevenness of the LEDs. Therefore, it could avoid the Mura issue caused by current variations between different LEDs due to the IR-drop in the signal line in the display panel and the unevenness of the LEDs and raises the stability of the display device. It should be noticed that the order for illustrating the following embodiments does not imply the preference of the embodiments.

Figure 1:
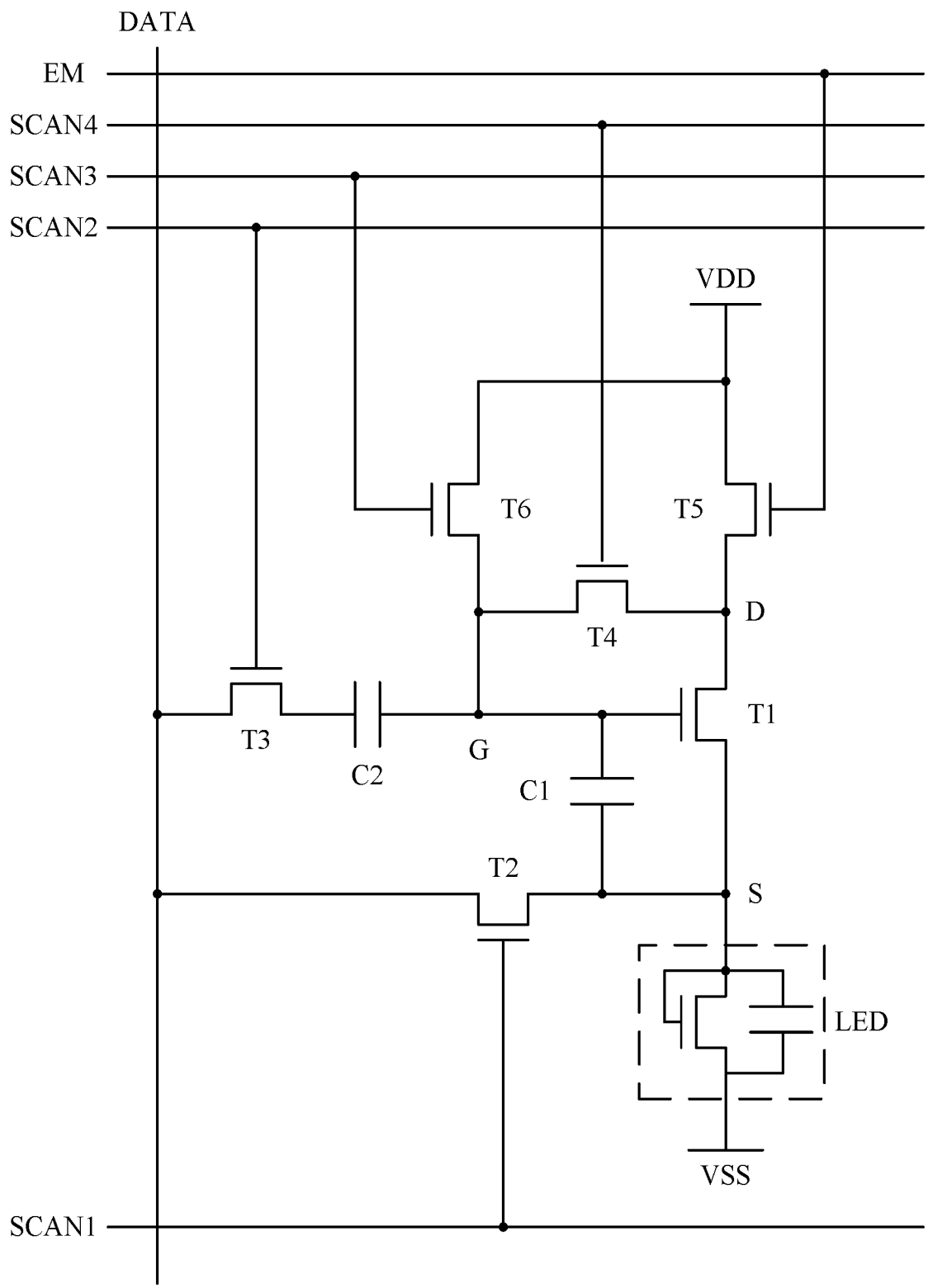
FIG. 1 is a diagram of a pixel driving circuit according to an embodiment of the present disclosure.

Please refer to FIG. 1. FIG. 1 is a diagram of a pixel driving circuit according to an embodiment of the present disclosure. The pixel driving circuit comprises a first TFT T1, a second TFT T2, a third TFT T3, a fourth TFT T4, a fifth TFT T5, a sixth TFT T6, a first capacitor C1, a second capacitor C2 and a light emitting diode LED. In addition, the pixel driving circuit further comprises a first scan line, a second scan line, a third scan line, a fourth scan line, a light emitting control signal line, a data line, a power line, and a common signal line.

The gate of the first TFT T1 is connected to a first node G. The first electrode of the first TFT T1 is connected to a second node D. The second electrode of the first TFT T1 is connected to a third node S.

The gate of the second TFT T2 is connected to the first scan line to receive a first scan signal SCAN1. The first electrode of the second TFT T2 is connected to the data line to receive the data signal DATA. The second electrode of the second TFT T2 is connected to the third node S.

The gate of the third TFT T3 is connected to the second scan line to receive the second scan signal SCAN2. The first electrode of the third TFT T3 is connected to the data signal line to receive the data signal DATA. The second electrode of the third TFT T3 is connected to the first electrode plate of the second capacitor C2.

The gate of the fourth TFT T4 is connected to the fourth scan line to receive the fourth scan signal SCAN4. The first electrode of the fourth TFT T4 is connected to the first node G. The second electrode of the fourth TFT T4 is connected to the second node D.

The gate of the fifth TFT T5 is connected to the light emitting control signal to receive the light emitting control signal EM. The first electrode of the fifth TFT T5 is connected to the power signal line to receive the power signal VDD. The second electrode of the fifth TFT T5 is connected to the second node D.

The gate of the sixth TFT T6 is connected to the third scan line to receive the third scan signal SCAN3. The first electrode of the sixth TFT T6 is connected to the power signal line to receive the power signal VDD. The second electrode of the sixth TFT T6 is connected to the first node G.

The first electrode plate of the first capacitor C1 is connected to the first node G. The second electrode plate of the first capacitor C1 is connected to the third node S.

The first electrode plate of the second capacitor C2 is connected to the second electrode of the third TFT T3. The second electrode plate of the second capacitor C2 is connected to the first node G.

The anode of the light emitting diode LED is connected to the third node S. The cathode of the light emitting diode LED is connected to the common signal line to receive the common signal VSS.

In the pixel driving circuit, the first scan signal SCAN1 is used to turn on/off the second TFT T2, the second scan signal SCAN2 is used to turn on/off the third TFT T3, the third scan signal SCAN3 is used to turn on/off the sixth TFT T6, the fourth scan signal SCAN4 is used to turn on/off the fourth TFT T4, and the light emitting control signal EM is used to turn on/off the fifth TFT T5.

The first TFT T1 is a driving transistor, configured to drive the light emitting diode LED to emit light under the control of the first node G.

The second TFT T2 is a first initialization transistor, configured to initialize the voltage of the third node S under the control of the first scan signal SCAN1.

The third TFT T3 is a data write-in transistor, configured write the data signal into the first node G under the control of the second scan signal SCAN2.

The fourth TFT T4 is a detecting transistor, configured to detect the threshold voltage of the driving transistor T1 under the control of the fourth scan signal SCAN4.

The fifth TFT T5 is a switch transistor, configured to establish/break the electrical connection between the first TFT T1 and the power signal VDD under the control of the light emitting control signal EM.

The sixth TFT T6 is a second initialization transistor, configured to initialize the voltage of the first node G under the control of the third scan signal SCAN3.

The first capacitor C1 is a storage capacitor, configured to store the voltage signal of the first node G.

The second capacitor C2 is a data write-in capacitor, configured to write the data signal into the first node G.

The light emitting diode LED comprises an LED capacitor and an LED transistor. The LED capacitor and the LED transistor are connected in parallel. The two ends of the parallel connected LED capacitor and the LED transistor are respectively connected to the third node S and the common signal line. In an embodiment, the light emitting diode represents a light emitting display unit including a diode. That is, the light emitting diode comprises, but not limited to, an LED, a mini-LED, a micro-LED, and/or an OLED.

One of the first TFT T1, the second TFT T2, the third TFT T3, the fourth TFT T4, the fifth TFT T5 and the sixth TFT T6 is a single-crystalline silicon TFT, a poly-silicon TFT, an amorphous TFT, an oxide TFT, a low temperature poly-silicon oxide transistor or an organic TFT. These changes all fall within the scope of the present disclosure.

One of the first TFT T1, the second TFT T2, the third TFT T3, the fourth TFT T4, the fifth TFT T5 and the sixth TFT T6 is an N-type transistor or a P-type transistor. In addition, the first electrode and the second electrode of the TFT could be respectively the source and the drain or could be respectively the drain and the source. These changes all fall within the scope of the present disclosure.

In the pixel driving circuit shown in FIG. 1, all of the first TFT T1, the second TFT T2, the third TFT T3, the fourth TFT T4, the fifth TFT T5 and the sixth TFT T6 are N-type transistors. The first electrode of any the first TFT T1, the second TFT T2, the third TFT T3, the fourth TFT T4, the fifth TFT T5 and the sixth TFT T6 is the source. The second electrode of any the first TFT T1, the second TFT T2, the third TFT T3, the fourth TFT T4, the fifth TFT T5 and the sixth TFT T6 is the drain. Furthermore, as the N-type transistor, when a high voltage is applied on the gate of any the first TFT T1, the second TFT T2, the third TFT T3, the fourth TFT T4, the fifth TFT T5 and the sixth TFT T6, the TFT is turned on.

Figure 2:
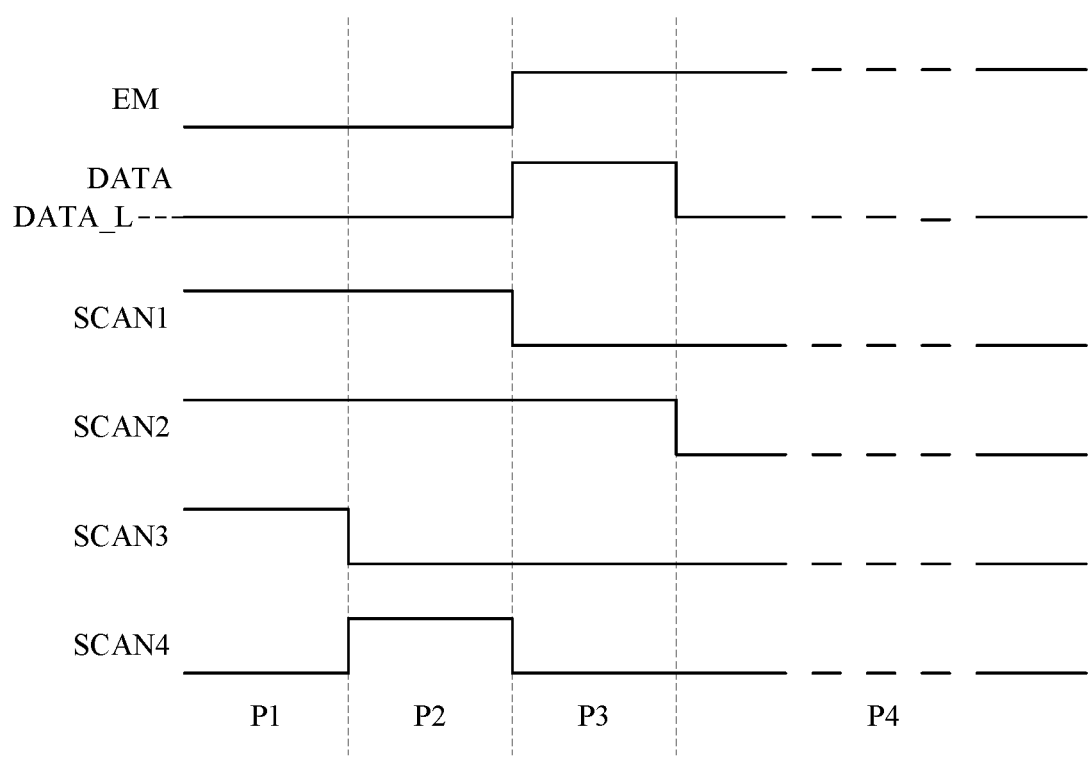
FIG. 2 is a timing diagram of a pixel driving circuit according to an embodiment of the present disclosure.

According to an embodiment, a pixel driving method is disclosed. The pixel driving method is adopted in the pixel driving circuit of any one of the above-mentioned embodiments to drive a pixel. Please refer to FIG. 1 in conjunction with FIG. 2. FIG. 2 is a timing diagram of a pixel driving circuit according to an embodiment of the present disclosure. In the following disclosure, the pixel driving method will be illustrated in detail with the pixel driving circuit shown in FIG. 1 and the timing diagram of the pixel driving circuit shown in FIG. 2. In one embodiment, in the pixel driving circuit shown in FIG. 1, all of the first TFT T1, the second TFT T2, the third TFT T3, the fourth TFT T4, the fifth TFT T5 and the sixth TFT T6 are N-type transistors. The first electrode of any the first TFT T1, the second TFT T2, the third TFT T3, the fourth TFT T4, the fifth TFT T5 and the sixth TFT T6 is the source. The second electrode of any the first TFT T1, the second TFT T2, the third TFT T3, the fourth TFT T4, the fifth TFT T5 and the sixth TFT T6 is the drain. In an embodiment, the pixel driving method has fourth phases, the initialization phase P1, the threshold voltage detecting phase P2, the data write-in phase P3 and the light emitting phase P4.

In the initialization phase P1, the first scan signal SCAN1, the second scan signal SCAN2 and the third scan signal SCAN3 all correspond to a high voltage level and the fourth scan signal SCAN4, the data signal DATA the light emitting control signal EM correspond to a low voltage level. In this way, the second TFT T2, the third TFT T3 and the sixth TFT T6 are turned on and the fourth TFT T4 and the fifth TFT T5 are turned off. The power signal VDD is written into the first node G through the sixth TFT T6. Due to the second capacitor C2, the data signal having a low voltage DATA_L cannot be written into the first node G through the third TFT T3 in this phase. Instead, the data signal DATA_L is written into the third node S through the second TFT T2. Therefore, in the initialization phase P1, the voltage level of the first node G is initialized as the power signal VDD and the voltage level of the third node S is initialized as a low voltage level of the data signal DATA_L.

In the threshold voltage detecting phase P2, the first scan signal SCAN1 and the second scan signal SCAN2 correspond to a high voltage level. The third scan signal SCAN3 changes from a high voltage level to a low voltage level. The fourth scan signal SCAN4 changes from a low voltage level to a high voltage level. The data signal DATA and the light emitting control signal EM still correspond to a low voltage level. In this way, the second TFT T2, the third TFT T3 are still turned on. The fifth TFT T5 and the sixth TFT T6 are turned off. The fourth TFT T4 is turned on and forms a diode structure to detect the threshold voltage $V_{th}$ of the first TFT T1. The data signal DATA_L is written into the first node G through the third TFT T3. The voltage level of the first node G changes from the power signal VDD to the voltage level DATA_L+$V_{th}$. The voltage level of the third node S is still the data signal DATA_L.

In the data write-in phase P3, the first scan signal SCAN1 changes from a high voltage level to a low voltage level. The second scan signal SCAN2 still corresponds to a high voltage level. The third scan signal SCAN3 still corresponds to a low voltage level. The fourth scan signal SCAN4 changes from a high voltage level to a low voltage level. The data signal DATA and the light emitting signal EM change from a low voltage level to a high voltage level. In this way, the second TFT T2, the third TFT T3, the fourth TFT T4 and the sixth TFT T6 are turned off. The fifth TFT and the first TFT T1 are turned on. The power signal VDD is inputted to the first electrode of the first TFT T1 through the fifth TFT T5. The common signal VSS is written into the cathode of the light emitting diode LED (that is, the common signal VSS is written into the second electrode plate of the LED capacitor). Therefore, the voltage level of the third node S becomes V_LED+VSS. The voltage level of the first node becomes DATA_H+$V_{th}$−(DATA_H−DATA_L)*C1/(C1+C_LED)+V_LED+VS. That is, $V_{gs}$−$V_{th}$=DATA_H−(DATA_H−DATA_L)*C1/(C1+C_LED).

In the light emitting phase P4, the first scan signal SCAN1 maintains the low voltage level, the second scan signal SCAN2 changes from the high voltage level to the low voltage level, the third scan signal SCAN3 maintains the low voltage level, and the fourth scan signal SCAN4 maintains the low voltage level. In addition, the data signal DATA changes from a high voltage level to a low voltage level, and the light emitting control signal EM corresponds to the high voltage level. In the light emitting phase P4, the second TFT T2, the third TFT T3, the fourth TFT T4, and the sixth TFT T6 are turned off, while the fifth TFT T5 and the first TFT T1 are turned on. The power signal VDD is input to the first electrode of the first TFT T1 through the fifth TFT T5, and the common signal VSS is written into the cathode of the light emitting diode LED, i.e., the second electrode plate of the light emitting diode capacitance. Accordingly, the voltage applied on the third node S becomes V_LED+VSS, and the voltage applied on of the first node G becomes DATA_H+Vth−(DATA_H−DATA_L)*C1/(C1+C_LED)+V_LED+VSS. That is, Vgs−Vth=DATA_H−(DATA_H−DATA_L)*C1/(C1+C_LED).

According to an embodiment, a display device is disclosed. The display device comprises a pixel driving circuit of any one of the above-mentioned embodiments and could use a pixel driving method of any one of the above-mentioned embodiments. Since the pixel driving circuit and the pixel driving method are well illustrated in the above, further details are omitted here.

In conclusion, the present disclosure provides a pixel driving circuit, a pixel driving method and a display device. The pixel driving circuit comprises a first TFT, a third TFT, a fourth TFT, a first capacitor, a second capacitor and a light emitting diode. In the threshold detecting phase, the threshold voltage of the first TFT is detected through the fourth TFT. In the data write-in phase, the data voltage is written into the first node G through the third TFT. In addition, the first capacitor and the light emitting diode is connected in parallel to use the capacitor of the light emitting diode to alleviate the coupling effect of the voltage variation of the first node on the third node such that the voltage of the third node could be stabilized. In the light emitting phase, the first capacitor and the light emitting diode work together to compensate for the threshold voltage, IR drop in the signal and the unevenness of the LEDs. This could avoid the Mura issue caused by current variations between different LEDs due to the IR-drop in the signal line in the display panel and the unevenness of the LEDs and raises the stability of the display device.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. A pixel driving method adopted by a driving circuit to drive a pixel, the driving circuit comprising:
   a first thin film transistor (TFT), having a gate electrically connected to a first node, a first electrode electrically connected to a second node, and a second electrode electrically connected to a third node;
   a first capacitor, having a first electrode plate electrically connected to the first node and a second electrode plate electrically connected to the third node;
   a second TFT, having a gate receiving a first scan signal, a first electrode receiving a data signal for initialization, and a second electrode electrically connected to the third node;
   a third TFT, having a gate receiving a second scan signal, a first electrode receiving a data signal for data write-in, and a second electrode;
   a fourth TFT, having a gate receiving a fourth scan signal, a first electrode electrically connected to the first node, and a second electrode electrically connected to the second node;
   a second capacitor, having a first electrode plate electrically connected to the second electrode of the third TFT and a second electrode plate electrically connected to the first node; and
   a light emitting diode (LED), having an anode electrically connected to the third node and a cathode receiving a common signal;
   the method comprising:
      in an initialization phase, performing an initialization process to apply a power signal to the first node to initialize a voltage of the first node and to apply the data signal for initialization to the third node to initialize a voltage of the third node;
      in a threshold voltage detecting phase, turning on the fourth TFT to detect a threshold voltage of the first TFT, wherein the fourth scan signal has an effective voltage level;
      in a data write-in phase, turning on the third TFT to write in the data signal for data write-in as a data voltage into the first node, wherein the second scan signal has an effective voltage level and the first capacitor and the light emitting diode are connected in parallel; and
      in a light emitting phase, turning on the first TFT such that the power signal is transferred through the first TFT to the light emitting diode;
   wherein the first electrode of the second TFT and the first electrode of the third TFT are connected to a data line.

* * * * *